United States Patent
Kishimura et al.

(10) Patent No.: US 6,830,869 B2
(45) Date of Patent: Dec. 14, 2004

(54) PATTERN FORMING MATERIAL AND METHOD OF PATTERN FORMATION

(75) Inventors: Shinji Kishimura, Itami (JP); Masayuki Endo, Izumi (JP); Masaru Sasago, Hirataka (JP); Mitsuru Ueda, Tokyo (JP); Tsuyohiko Fujigaya, Koshigaya (JP)

(73) Assignee: Atsushita Electric Industrial Co., Ltd., Osaka (JP)

( * ) Notice: Subject to any disclaimer, the term of this patent is extended or adjusted under 35 U.S.C. 154(b) by 72 days.

(21) Appl. No.: 10/415,434
(22) PCT Filed: Sep. 12, 2002
(86) PCT No.: PCT/JP02/09380
§ 371 (c)(1), (2), (4) Date: Apr. 29, 2003
(87) PCT Pub. No.: WO03/025675
PCT Pub. Date: Mar. 27, 2003

(65) Prior Publication Data
US 2004/0043321 A1 Mar. 4, 2004

(30) Foreign Application Priority Data
Sep. 13, 2001 (JP) .............................. 2001-277594

(51) Int. Cl.$^7$ ............................................. G03F 7/004
(52) U.S. Cl. .................. 430/270.1; 430/905; 430/907; 430/910; 430/326; 526/287
(58) Field of Search ............................. 430/270.1, 326, 430/905, 907, 910; 526/287, 281

(56) References Cited

U.S. PATENT DOCUMENTS

| | | | | |
|---|---|---|---|---|
| 4,288,520 A | * | 9/1981 | Sprintschnik et al. | 430/169 |
| 4,606,989 A | * | 8/1986 | Uytterhoeven et al. | 430/114 |
| 6,468,712 B1 | * | 10/2002 | Fedynyshyn | 430/270.1 |
| 2002/0081524 A1 | | 6/2002 | Uetani et al. | |
| 2003/0087184 A1 | * | 5/2003 | Kishimura et al. | 430/270.1 |
| 2004/0029035 A1 | * | 2/2004 | Kishimura et al. | 430/270.1 |

FOREIGN PATENT DOCUMENTS

| | | |
|---|---|---|
| EP | 773478 A1 | 5/1997 |
| EP | 791856 A2 | 8/1997 |
| JP | 11-218926 A | 8/1999 |
| JP | 2000-330289 A | 11/2000 |
| JP | 2002-322217 A | 11/2002 |
| JP | 2002-333715 A | 11/2002 |

* cited by examiner

Primary Examiner—Rosemary Ashton
(74) Attorney, Agent, or Firm—McDermott Will & Emery LLP

(57) ABSTRACT

A pattern formation material of this invention contains a base polymer including a first unit represented by Chemical Formula 1 and a second unit represented by Chemical Formula 2 and, and an acid generator:

Chemical Formula 1:

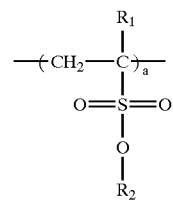

Chemical Formula 2:

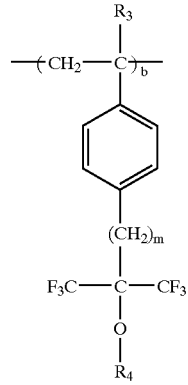

wherein $R_1$ and $R_3$ are the same or different and are a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_4$ is a protecting group released by an acid; m is an integer of 0 through 5; and a and b satisfy $0<a<1$, $0<b<1$ and $0<a+b\leq 1$.

19 Claims, 2 Drawing Sheets

PATTERN FORMING MATERIAL AND METHOD OF PATTERN FORMATION

TECHNICAL FIELD

The present invention relates to a pattern formation method and a pattern formation material, and more particularly, it relates to a pattern formation method for forming a resist pattern, for use in forming a semiconductor device or a semiconductor integrated circuit on a semiconductor substrate, by using exposing light of a wavelength not longer than a 180 nm band and a pattern formation material used in the pattern formation method.

BACKGROUND ART

Currently, in fabrication of a mass storage semiconductor integrated circuit, such as a 64 Mbit dynamic random access memory (DRAM) and a logic device or a system LSI with a 0.25 μm through 0.15 μm rule, a resist pattern is formed by using a chemically amplified resist material including a polyhydroxystyrene derivative and an acid generator as principal constituents with KrF excimer laser (wavelength: a 248 nm band) used as exposing light.

Moreover, for fabrication of a 256 Mbit DRAM, a 1 Gbit DRAM or a system LSI with a 0.15 μm through 0.13 μm rule, a pattern formation method using, as exposing light, ArF excimer laser (wavelength: a 193 nm band) lasing at a shorter wavelength than the KrF excimer laser is now under development.

The resist material including a polyhydroxystyrene derivative as a principal constituent has high absorbance against light of a wavelength of a 193 nm band because of an aromatic ring included therein. Therefore, exposing light of a wavelength of a 193 nm band cannot uniformly reach the bottom of a resist film, and hence, a pattern cannot be formed in a good shape. Accordingly, the resist material including a polyhydroxystyrene derivative as a principal constituent cannot be used when the ArF excimer laser is used.

Therefore, a chemically amplified resist material including, as a principal constituent, a polyacrylic acid derivative or a polycycloolefin derivative having no aromatic ring is used when the ArF excimer laser is used as the exposing light.

On the other hand, as exposing light for a pattern formation method capable of coping with high resolution, an electron beam (EB) and the like are being examined.

When the EB is used as the exposing light, however, the throughput is disadvantageously low, and hence, the EB is not suitable to mass production. Thus, the EB is not preferred as the exposing light.

Accordingly, in order to form a resist pattern finer than 0.10 μm, it is necessary to use exposing light of a wavelength shorter than that of the ArF excimer laser, such as $Xe_2$ laser (wavelength: a 172 nm band), $F_2$ laser (wavelength: a 157 nm band), $Kr_2$ laser (wavelength: a 146 nm band), ArKr laser (wavelength: a 134 nm band), $Ar_2$ laser (wavelength: a 126 nm band), soft X-rays (wavelength: a 13, 11 or 5 nm band) and hard X-rays (wavelength: not longer than a 1 nm band). In other words, a resist pattern is required to be formed by using exposing light of a wavelength not longer than a 180 nm band.

Therefore, the present inventors have formed resist patterns by conducting pattern exposure using a $F_2$ laser beam (wavelength: a 157 nm band) on resist films formed from conventionally known chemically amplified resist materials respectively including a polyhydroxystyrene derivative represented by Chemical Formula 21, a polyacrylic acid derivative represented by Chemical Formula 22 and a polycycloolefin derivative represented by Chemical Formula 23.

Chemical Formula 21:

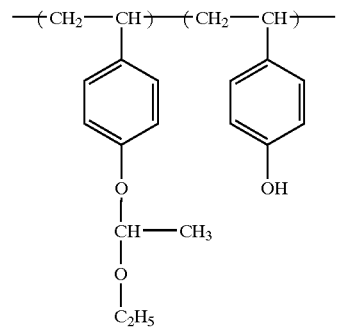

Chemical Formula 22:

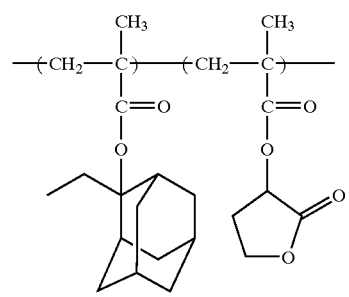

Chemical Formula 23:

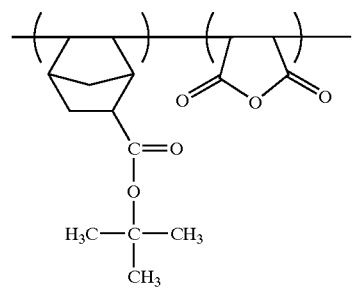

Now, a method for forming a resist pattern by using any of the aforementioned conventional chemically amplified resist materials and problems arising in the conventional method will be described with reference to FIGS. 2(a) through 2(d).

First, as shown in FIG. 2(a), the aforementioned chemically amplified resist material is applied on a semiconductor substrate 1 by spin coating and the resultant is heated, so as to form a resist film 2 with a thickness of 0.3 μm. Thereafter, as shown in FIG. 2(b), the resist film 2 is irradiated with a $F_2$ laser beam 4 through a mask 3 for pattern exposure. Thus, an acid is generated from the acid generator in an exposed portion 2a of the resist film 2 while no acid is generated in an unexposed portion 2b of the resist film 2.

Next, as shown in FIG. 2(c), the semiconductor substrate 1 is heated with a hot plate 5 at a temperature of, for example, 100° C. for 60 seconds.

Then, the resist film 2 is developed with an alkaline developer, thereby forming a resist pattern 6 as shown in FIG. 2(d).

However, as shown in FIG. 2(d), the resist pattern 6 is formed in a defective pattern shape, and there remains much scum (residues) on the semiconductor substrate 1. Such problems occur not only in using the $F_2$ laser beam as the exposing light but also in using any of the other light of a wavelength not longer than a 180 nm band.

Accordingly, a resist pattern cannot be practically formed by irradiating a resist film formed from any of the aforementioned chemically amplified resist materials with light of a wavelength not longer than a 180 nm band.

DISCLOSURE OF THE INVENTION

In consideration of the aforementioned conventional problems, an object of the invention is forming a resist pattern in a good pattern shape by using exposing light of a wavelength not longer than a 180 nm band with minimally producing scum.

The present inventors have studied the cause of the conventional problems occurring in using the conventional chemically amplified resist materials and have found the following:

First, the chemically amplified resist materials have high absorbance against light of a wavelength not longer than a 180 nm band. For example, a resist film with a thickness of 100 nm formed from the chemically amplified resist material including a polyhydroxystyrene derivative has transmittance of 20% at most against a $F_2$ laser beam (wavelength: a 157 nm band).

Therefore, various examination has been made on means for improving the transmittance of a chemically amplified resist material against light of a wavelength not longer than a 180 nm band. As a result, it has been found that a unit represented by Chemical Formula 1 and a unit represented by Chemical Formula 2 improve the transmittance against light of a wavelength not longer than a 180 nm band.

The present invention was devised on the basis of the aforementioned finding, and specifically provides pattern formation materials and methods described below.

The first pattern formation material comprises a base polymer including a first unit represented by Chemical Formula 1 and a second unit represented by Chemical Formula 2; and an acid generator:

Chemical Formula 1:

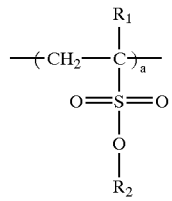

-continued
Chemical Formula 2:

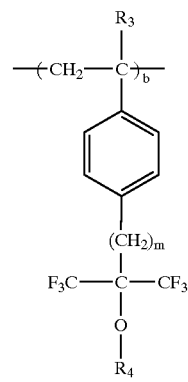

wherein $R_1$ and $R_3$ are the same or different and are a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_4$ is a protecting group released by an acid; m is an integer of 0 through 5; and a and b satisfy $0<a<1$, $0<b<1$ and $0<a+b\leq 1$.

Since the base polymer of the first pattern formation material includes the first unit and the second unit, the transmittance of a resist film against light of a wavelength not longer than a 180 nm band is improved. Also, since hexafluoroisopropyl alcohol is generated when $R_4$ is released from the second unit owing to the function of an acid, the solubility of an exposed portion of the resist film in a developer is improved, and hence, the contrast in the solubility between the exposed portion and an unexposed portion of the resist film is improved. Furthermore, since the second unit has a benzene ring, resistance against dry etching is improved.

In the first pattern formation material, the base polymer can be prepared through radical polymerization of the first unit and the second unit.

In the first pattern formation material, the base polymer can be prepared by obtaining a polymer through radical polymerization of the first unit and a precursor obtained before substituting $R_4$ for the second unit and by allowing $R_4$ to bond to the precursor included in the polymer.

The second pattern formation material comprises a base polymer including a first unit represented by Chemical Formula 1, a second unit represented by Chemical Formula 2 and a third unit represented by Chemical Formula 3; and an acid generator:

Chemical Formula 1:

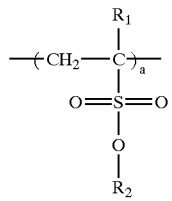

Chemical Formula 2:

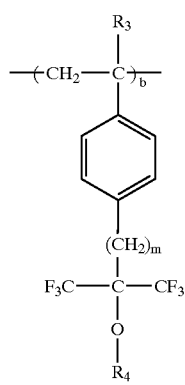

Chemical Formula 3:

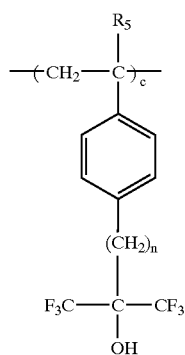

wherein $R_1$, $R_3$ and $R_5$ are the same or different and are a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_4$ is a protecting group released by an acid; m is an integer of 0 through 5; n is an integer of 0 through 5; and a, b and c satisfy $0<a<1$, $0<b<1$, $0<c<1$ and $0<a+b+c\leq 1$.

In the second pattern formation material, since the base polymer includes the first unit, the second unit and the third unit, the transmittance of a resist film against light of a wavelength not longer than a 180 nm band is largely improved. Also, hexafluoroisopropyl alcohol is generated when $R_4$ is released from the second unit owing to the function of an acid, and the third unit has hexafluoroisopropyl alcohol. Therefore, the solubility of an exposed portion of the resist film in a developer is improved, so that the contrast in the solubility between the exposed portion and an unexposed portion of the resist film can be largely improved. In addition, the wettability of the resist film is improved so as to largely improve adhesion between the resist film and a substrate. Furthermore, since the second unit and the third unit respectively have benzene rings, the resistance against dry etching is largely improved.

In the second pattern formation material, the base polymer can be prepared through radical polymerization of the first unit, the second unit and the third unit.

In the second pattern formation material, the base polymer can be prepared by obtaining a polymer through radical polymerization of the first unit and the third unit and by substituting $R_4$ for some of H of OH groups of the third unit included in the polymer.

The third pattern formation material comprises a base polymer including a first unit represented by Chemical Formula 1 and a second unit represented by Chemical Formula 4; and an acid generator:

Chemical Formula 1:

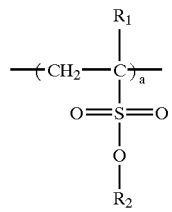

Chemical Formula 4:

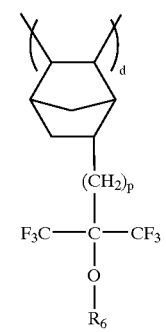

wherein $R_1$ is a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_6$ is a protecting group released by an acid; p is an integer of 0 through 5; and a and d satisfy $0<a<1$, $0<d<1$ and $0<a+d\leq 1$.

In the third pattern formation material, since the base polymer includes the first unit and the second unit, the transmittance of a resist film against the light of a wavelength not longer than a 180 nm band is improved. In particular, since the second unit has a norbornene ring, the transmittance of the resist film against the light of a wavelength not longer than a 180 nm band is further improved than in the first pattern formation material. Also, since hexafluoroisopropyl alcohol is generated when $R_6$ is released from the second unit owing to the function of an acid, the solubility of an exposed portion of the resist film in a developer is improved, so that the contrast in the solubility between the exposed portion and an unexposed portion of the resist film can be improved. Furthermore, since the second unit has a norbornene ring, the resistance against dry etching is improved.

In the third pattern formation material, the base polymer can be prepared through radical polymerization of the first unit and the second unit.

In the third pattern formation material, the base polymer can be prepared by obtaining a polymer through radical polymerization of the first unit and a precursor obtained before substituting $R_6$ for the second unit and by allowing $R_6$ to bond to the precursor included in the polymer.

The fourth pattern formation material comprises a base polymer including a first unit represented by Chemical Formula 1, a second unit represented by Chemical Formula 4 and a third unit represented by Chemical Formula 5; and an acid generator:

Chemical Formula 1:

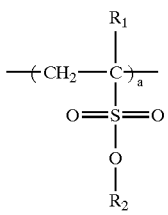

Chemical Formula 4:

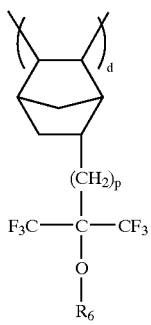

Chemical Formula 5:

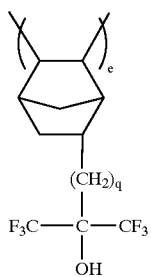

wherein $R_1$ is a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_6$ is a protecting group released by an acid; p is an integer of 0 through 5; q is an integer of 0 through 5; and a, d and e satisfy $0<a<1$, $0<d<1$, $0<e<1$ and $0<a+d+e\leqq 1$.

In the fourth pattern formation material, since the base polymer includes the first unit, the second unit and the third unit, the transmittance of a resist film against the light of a wavelength not longer than a 180 nm band is largely improved. In particular, since the second unit and the third unit respectively have norbornene rings, the transmittance of the resist film against the light of a wavelength not longer than a 180 nm band is further improved than in the second pattern formation material. Also, since hexafluoroisopropyl alcohol is generated when $R_6$ is released from the second unit owing to the function of an acid and the third unit has hexafluoroisopropyl alcohol, the solubility of an exposed portion of the resist film in a developer is improved so that the contrast in the solubility between the exposed portion and an unexposed portion of the resist film can be largely improved. In addition, the wettability of the resist film is improved so as to largely improve the adhesion between the resist film and a substrate. Furthermore, the second unit and the third unit respectively have norbornene rings, the resistance against dry etching is largely improved.

In the fourth pattern formation material, the base polymer can be prepared through radical polymerization of the first unit, the second unit and the third unit.

In the fourth pattern formation material, the base polymer can be prepared by obtaining a polymer through radical polymerization of the first unit and the third unit and by substituting $R_6$ for some of H of OH groups of the third unit included in the polymer.

The first pattern formation method comprises the steps of forming a resist film by applying, on a substrate, the first pattern formation material; irradiating the resist film with exposing light of a wavelength not longer than a 180 nm band for pattern exposure; and forming a resist pattern by developing the resist film after the pattern exposure.

In the first pattern formation method, since the first pattern formation material is used, the transmittance of the resist film against light of a wavelength not longer than a 180 nm band is improved, the contrast in the solubility between an exposed portion and an unexposed portion of the resist film is improved, and the resistance against dry etching is improved.

The second pattern formation method comprises the steps of forming a resist film by applying, on a substrate, the second pattern formation material; irradiating the resist film with exposing light of a wavelength not longer than a 180 nm band for pattern exposure; and forming a resist pattern by developing the resist film after the pattern exposure.

In the second pattern formation method, since the second pattern formation material is used, the transmittance of the resist film against the light of a wavelength not longer than a 180 nm band is largely improved, the contrast in the solubility between an exposed portion and an unexposed portion of the resist film is largely improved, the adhesion between the resist film and the substrate is largely improved, and the resistance against dry etching is largely improved.

The third pattern formation method comprises the steps of forming a resist film by applying, on a substrate, the third pattern formation material; irradiating the resist film with exposing light of a wavelength not longer than a 180 nm band for pattern exposure; and forming a resist pattern by developing the resist film after the pattern exposure.

In the third pattern formation method, since the third pattern formation material is used, the transmittance of the resist film against the light of a wavelength not longer than a 180 nm band is further improved, the contrast in the solubility between an exposed portion and an unexposed portion of the resist film is improved, and the resistance against dry etching is improved.

The fourth pattern formation method comprises the steps of forming a resist film by applying, on a substrate, the fourth pattern formation material; irradiating the resist film with exposing light of a wavelength not longer than a 180 nm band for pattern exposure; and forming a resist pattern by developing the resist film after the pattern exposure.

In the fourth pattern formation method, since the fourth pattern formation material is used, the transmittance of the resist film against the light of a wavelength not longer than a 180 nm band is more largely improved, the contrast in the solubility between an exposed portion and an unexposed portion of the resist film is largely improved, the adhesion between the resist film and the substrate is largely improved, and the resistance against dry etching is largely improved.

In any of the first through fourth pattern formation methods, the exposing light can be light of a wavelength of a 110 nm through 180 nm band, such as a $Xe_2$ laser beam, a $F_2$ laser beam, a $Kr_2$ laser beam, an ArKr laser beam or an $Ar_2$ laser beam; a soft-X ray beam of a wavelength of a 1 nm through 30 nm band; or a hard-X ray beam of a wavelength not longer than a 1 nm band.

BEST MODE FOR CARRYING OUT THE INVENTION (Embodiment 1)

A pattern formation material and a pattern formation method according to Embodiment 1 of the invention will now be described.

In Embodiment 1, the first pattern formation material and the first pattern formation method described in [Means for Solving Problems] are embodied, and the specific composition of a resist material is as follows:

Base polymer: a polymer represented by Chemical Formula 6

Acid generator: triphenylsulfonium triflate (5 wt % based on the base polymer)

Solvent: propylene glycol monomethyl ether acetate

Chemical Formula 6:

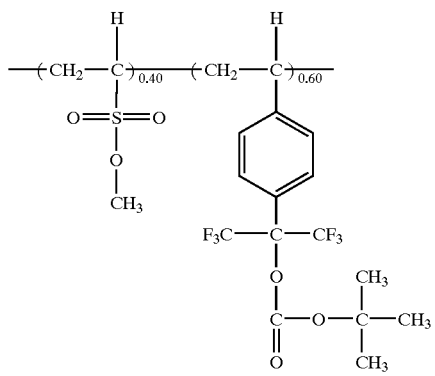

Chemical Formula 6 represents a specific example of the base polymer including the first unit represented by Chemical Formula 1 and the second unit represented by Chemical Formula 2.

Although $R_1$ of the first unit and $R_3$ of the second unit are both hydrogen atoms, they may be the same or different and may be a chlorine atom, a fluorine atom, an alkyl group or an alkyl group including a fluorine atom instead.

Also, as $R_2$ of the first unit, an atom or a group that is not released by an acid and is selected from the group consisting of a hydrogen atom, an alkyl group, a cyclic aliphatic group, an aromatic group, a heterocycle, an ester group and an ether group can be used.

Also, as $R_4$ of the second unit, for example, any of protecting groups represented by Chemical Formula 7 may be widely used.

Chemical Formula 7:

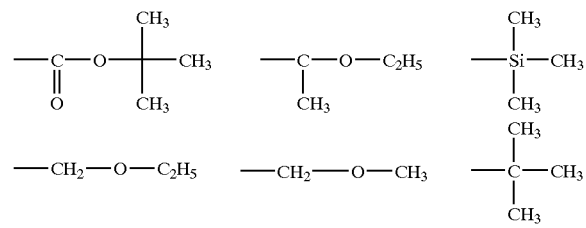

Furthermore, although m of the second unit is 0, it may be any integer of 1 through 5.

Now, a first synthesis method for the base polymer of the first pattern formation material will be described with reference to Chemical Formula 8.

Chemical Formula 8:

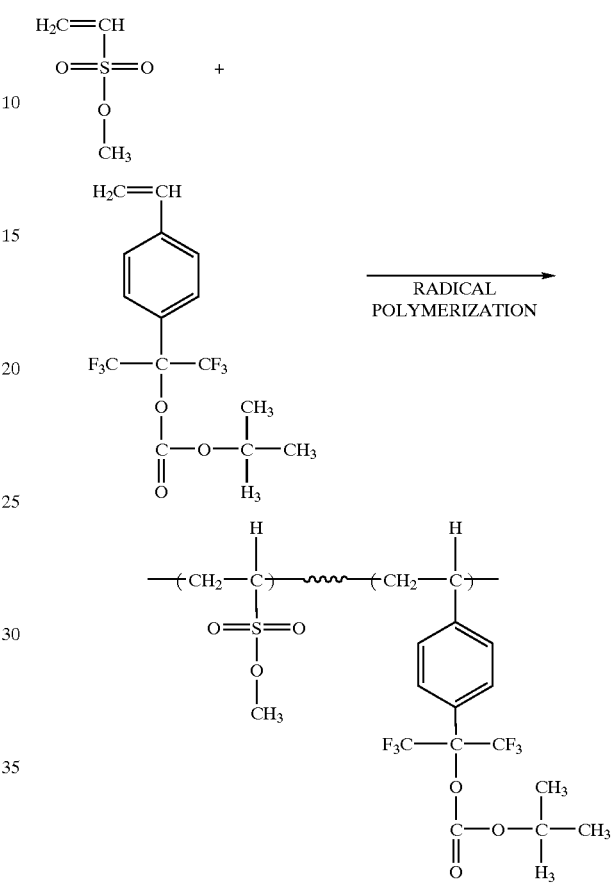

Specifically, as represented by Chemical Formula 8, the base polymer of the first pattern formation material is prepared through radical polymerization of the first unit represented by Chemical Formula 1 and the second unit represented by Chemical Formula 2. In this case, the first unit and the second unit can be easily radical polymerized.

Next, a second synthesis method for the base polymer of the first pattern formation material will be described with reference to Chemical Formula 9.

Chemical Formula 9:

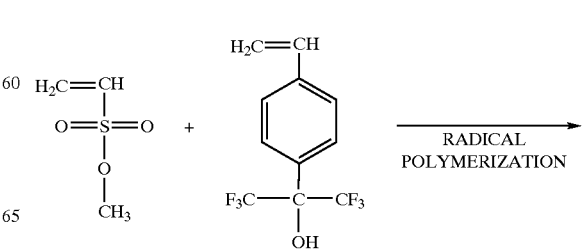

-continued

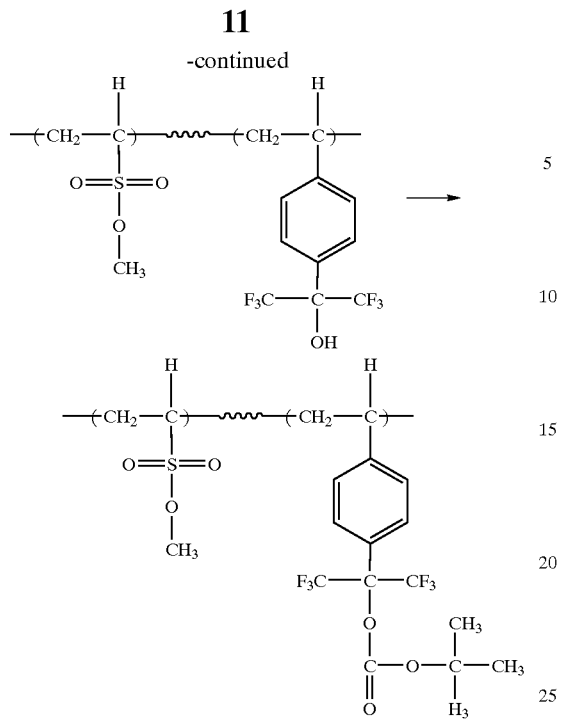

Specifically, as represented by Chemical Formula 9, a copolymer is obtained through radical polymerization of the first unit represented by Chemical Formula 1 and a precursor obtained before substituting $R_4$ for the second unit represented by Chemical Formula 2, and $R_4$ is allowed to bond to the precursor included in the copolymer. In this case, the first unit and the precursor can be easily radical polymerized.

Now, the pattern formation method of Embodiment 1 will be described with reference to FIGS. 1(a) through 1(d).

Figure 1:
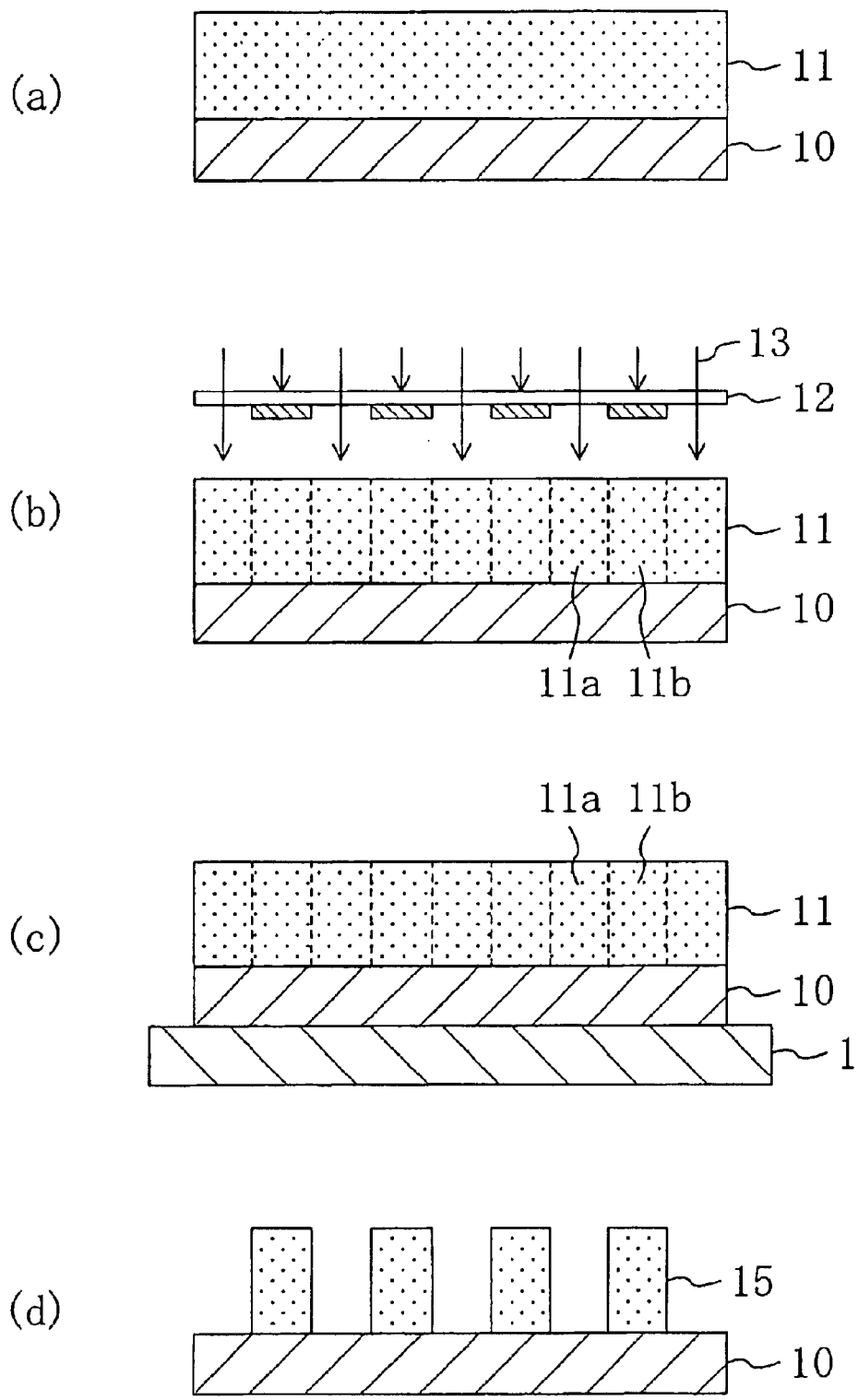
FIGS. 1(*a*) through 1(*d*) are cross-sectional views for showing procedures in a pattern formation method according to any of Embodiments 1 through 4 of the invention.
Figure 2:
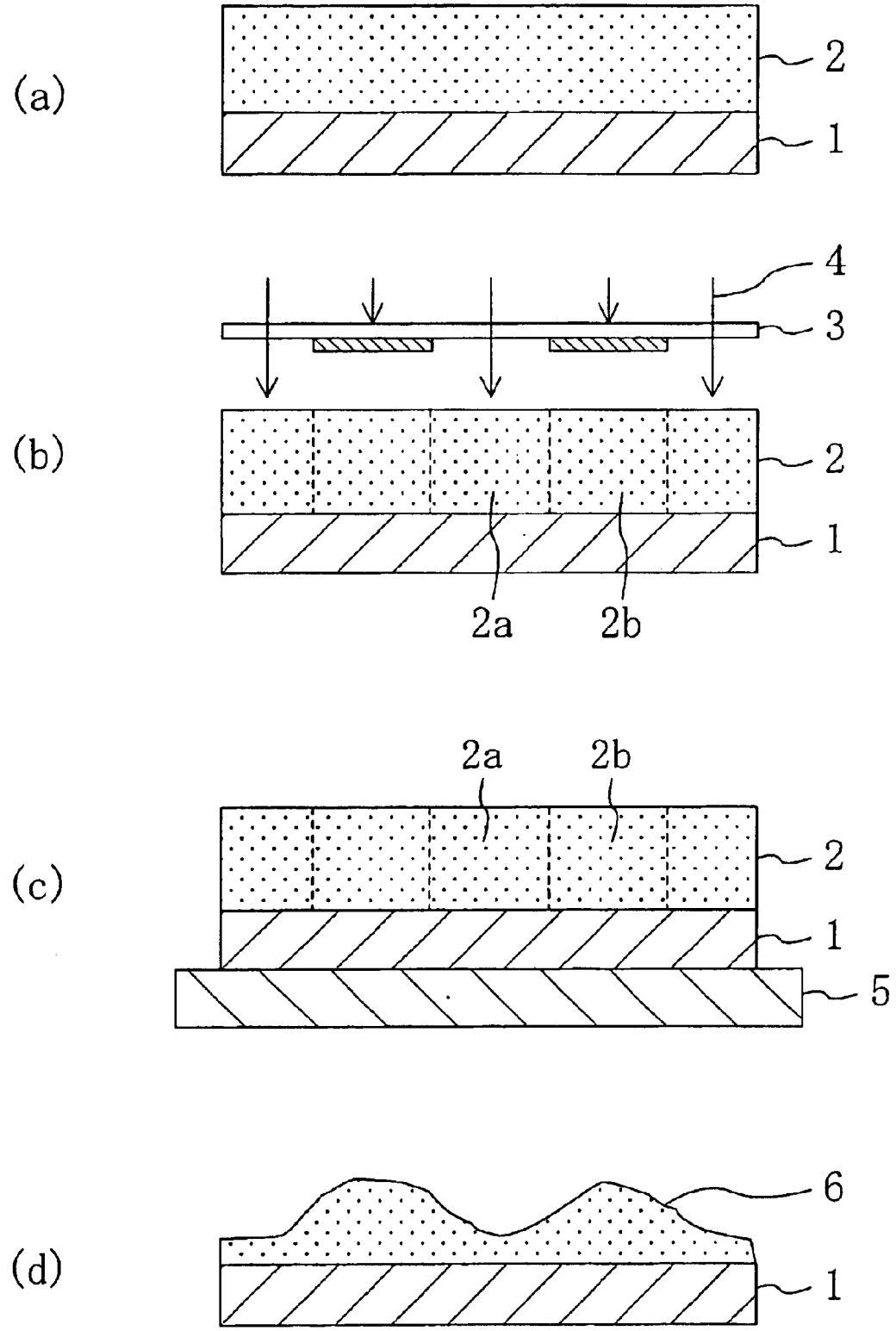
FIGS. 2(a) through 2(d) are cross-sectional views for showing procedures in a conventional pattern formation method.

First, as shown in FIG. 1(a), the resist material having the above-described composition is applied on a semiconductor substrate 10 by spin coating, thereby forming a resist film 11 with a thickness of 0.2 μm. At this point, since the base polymer is alkali-soluble the resist film 11 is alkali-insoluble.

Next, as shown in FIG. 1(b), the resist film 11 is subjected to pattern exposure by irradiating through a mask 12 with a $F_2$ excimer laser beam 13 (wavelength: a 157 nm band). Thus, an acid is generated from the acid generator in an exposed portion 11a of the resist film 11 while no acid is generated in an unexposed portion 11b of the resist film 11.

Then, as shown in FIG. 1(c), the semiconductor substrate 10 together with the resist film 11 is heated with a hot plate 14. Thus, the base polymer is heated in the presence of the acid in the exposed portion 11a of the resist film 11, so as to release the protecting group of Chemical Formula 2. As a result, the base polymer becomes alkali-soluble.

Subsequently, the resist film 11 is developed with an alkaline developer such as a tetramethylammonium hydroxide aqueous solution. Thus, the exposed portion 11a of the resist film 11 is dissolved in the developer, so that a resist pattern 15 can be formed from the unexposed portion 11b of the resist film 11 as shown in FIG. 1(d).

(Embodiment 2)

A pattern formation material and a pattern formation method according to Embodiment 2 of the invention will now be described. Embodiment 2 is different from Embodiment 1 in the resist material alone, and hence, the resist material alone will be herein described.

In Embodiment 2, the second pattern formation material and the second pattern formation method described in [Means for Solving Problems] are embodied, and the specific composition of the resist material is as follows:

Base polymer: a polymer represented by Chemical Formula 10

Acid generator: triphenylsulfonium triflate (5 wt % based on the base polymer)

Solvent: propylene glycol monomethyl ether acetate

Chemical Formula 10:

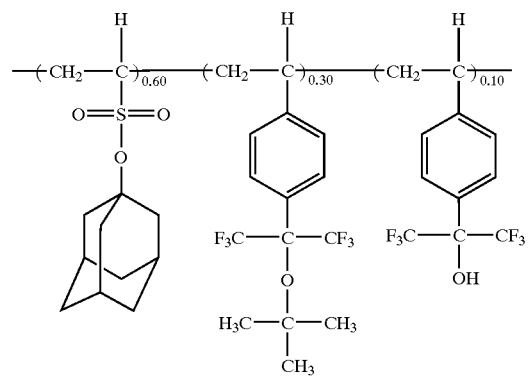

Chemical Formula 10 represents a specific example of the base polymer including the first unit represented by Chemical Formula 1, the second unit represented by Chemical Formula 2 and the third unit represented by Chemical Formula 3.

Although $R_1$ of the first unit, $R_3$ of the second unit and $R_5$ of the third unit are all hydrogen atoms, they may be the same or different and may be a chlorine atom, a fluorine atom, an alkyl group or an alkyl group including a fluorine atom instead.

Also, as $R_2$ of the first unit, an atom or a group that is not released by an acid and is selected from the group consisting of a hydrogen atom, an alkyl group, a cyclic aliphatic group, an aromatic group, a heterocycle, an ester group and an ether group can be used.

As $R_4$ of the first unit, for example, any of the protecting groups represented by Chemical Formula 7 may be widely used.

Although m of the second unit is 0, it may be any integer of 1 through 5 instead.

Also, although n of the third unit is 0, it may be any integer of 1 through 5 instead.

Now, a first synthesis method for the base polymer of the second pattern formation material will be described with reference to Chemical Formula 11.

Chemical Formula 11:

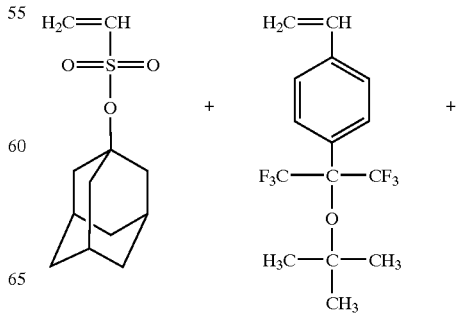

-continued

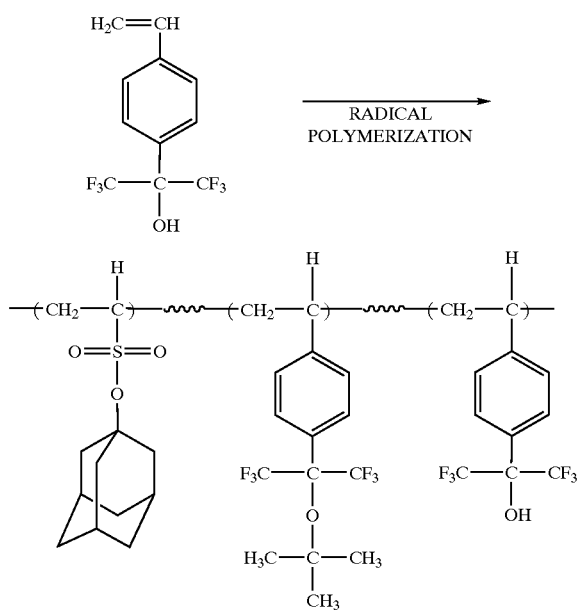

Specifically, as represented by Chemical Formula 11, the base polymer of the second pattern formation material is obtained through the radical polymerization of the first unit represented by Chemical Formula 1, the second unit represented by Chemical Formula 2 and the third unit represented by Chemical Formula 3. In this case, the first unit, the second unit and the third unit can be easily radical polymerized.

Next, a second synthesis method for the base polymer of the second pattern formation material will be described with reference to Chemical Formula 12.

Chemical Formula 12:

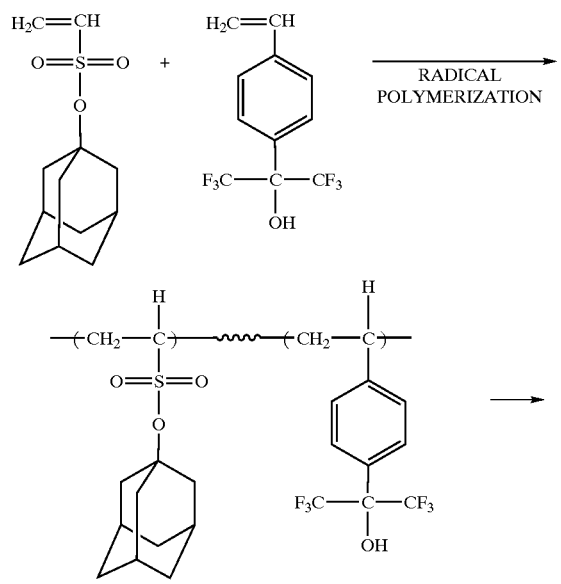

-continued

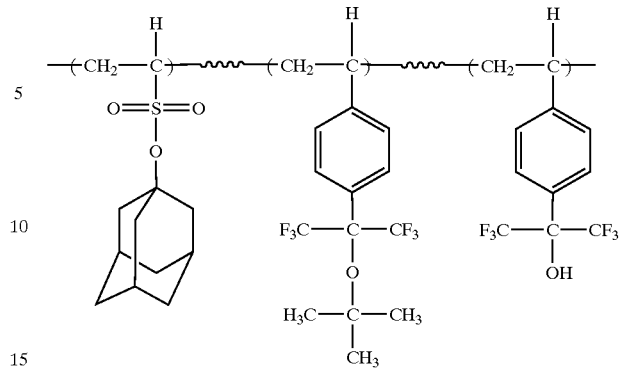

Specifically, a copolymer is obtained through the radical polymerization of the first unit represented by Chemical Formula 1 and the third unit represented by Chemical Formula 3, and $R_4$ is substituted for some of H of OH groups of the third unit included in the copolymer. In this case, the first unit and the third unit can be easily radical polymerized.

(Embodiment 3)

A pattern formation material and a pattern formation method according to Embodiment 3 of the invention will now be described. Embodiment 3 is different from Embodiment 1 in the resist material alone, and hence, the resist material alone will be herein described.

In Embodiment 3, the third pattern formation material and the third pattern formation method described in [Means for Solving Problems] are embodied, and the specific composition of the resist material is as follows:

Base polymer: a polymer represented by Chemical Formula 13

Acid generator: triphenylsulfonium triflate (5 wt % based on the base polymer)

Solvent: propylene glycol monomethyl ether acetate

Chemical Formual 13:

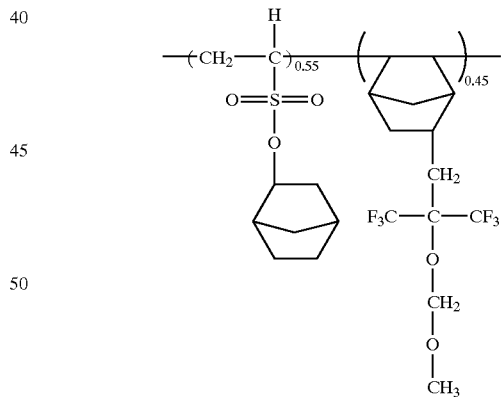

Chemical Formula 13 represents a specific example of the base polymer including the first unit represented by Chemical Formula 1 and the second unit represented by Chemical Formula 4.

Although $R_1$ of the first unit is a hydrogen atom, it may be a chlorine atom, a fluorine atom, an alkyl group or an alkyl group including a fluorine atom instead.

Also, as $R_2$ of the first unit, an atom or a group that is not released by an acid and is selected from the group consisting of a hydrogen atom, an alkyl group, a cyclic aliphatic group, an aromatic group, a heterocycle, an ester group and an ether group can be used.

As $R_6$ of the second unit, for example, any of the protecting groups represented by Chemical Formula 7 may be widely used.

Also, although p of the second unit is 1, it may be 0 or any integer of 2 through 5 instead.

Now, a first synthesis method for the base polymer of the third pattern formation material will be described with reference to Chemical Formula 14.

Chemical Formula14:

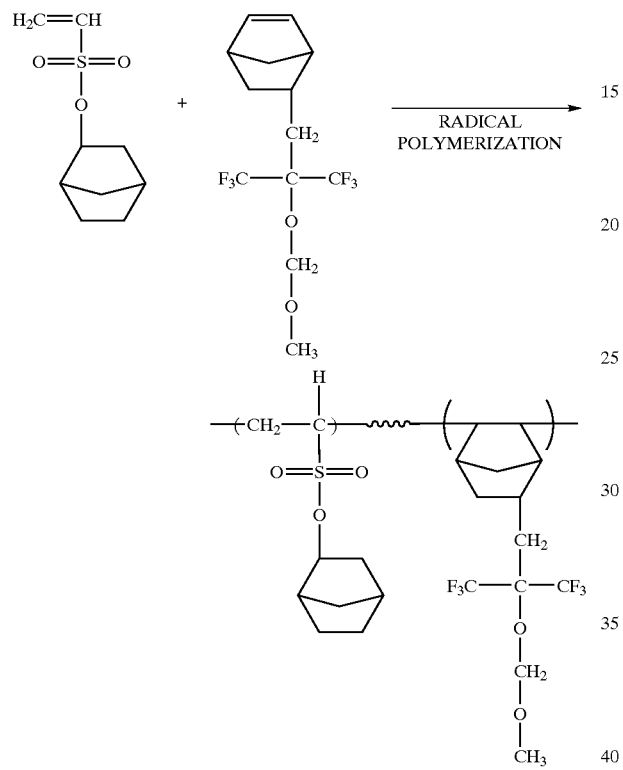

Specifically, the base polymer of the third pattern formation material is obtained through the radical polymerization of the first unit represented by Chemical Formula 1 and the second unit represented by Chemical Formula 4. In this case, the first unit and the second unit can be easily radical polymerized.

Next, a second synthesis method for the base polymer of the third pattern formation material will be described with reference to Chemical Formula 15.

Chemical Formula15:

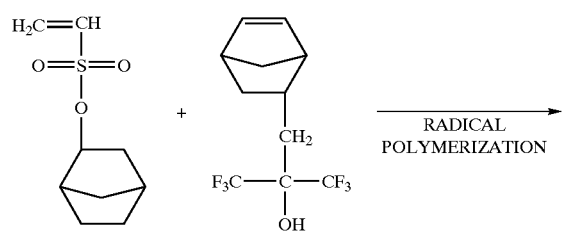

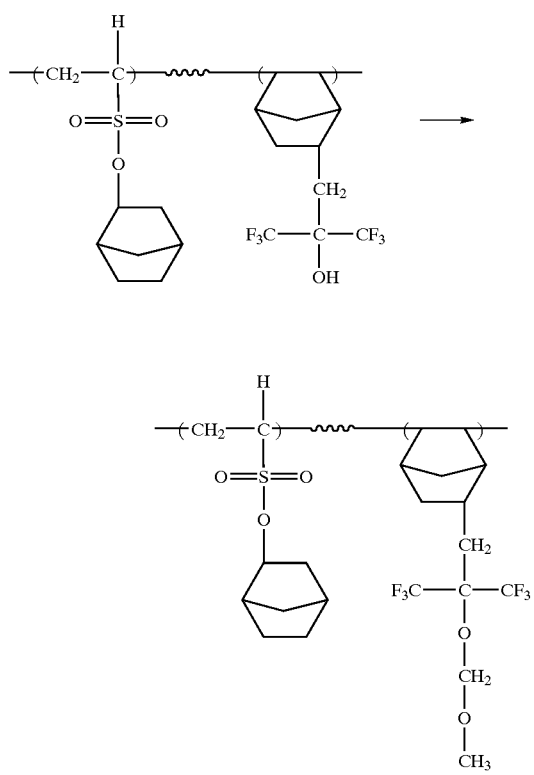

Specifically, a copolymer is obtained through the radical polymerization of the first unit represented by Chemical Formula 1 and a precursor obtained before substituting $R_6$ for the second unit represented by Chemical Formula 4, and $R_6$ is allowed to bond to the precursor included in the copolymer. In this case, the first unit and the precursor can be easily radical polymerized.

(Embodiment 4)

A pattern formation material and a pattern formation method according to Embodiment 4 of the invention will now be described. Embodiment 4 is different from Embodiment 1 in the resist material alone, and hence, the resist material alone will be herein described.

In Embodiment 4, the fourth pattern formation material and the fourth pattern formation method described in [Means for Solving Problems] are embodied, and the specific composition of the resist material is as follows:

Base polymer: a polymer represented by Chemical Formula 16

Acid generator: triphenylsulfonium triflate (5 wt % based on the base polymer)

Solvent: propylene glycol monomethyl ether acetate

Chemical Formula 16:

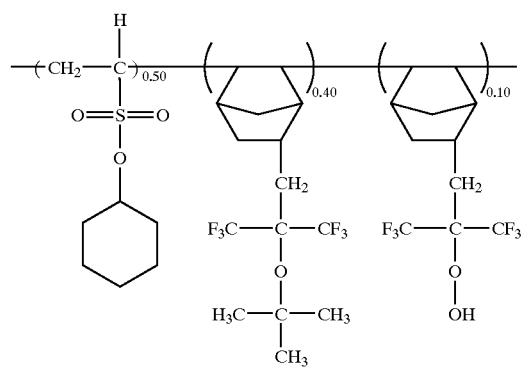

Chemical Formula 16 represents a specific example of the base polymer including the first unit represented by Chemical Formula 1, the second unit represented by Chemical Formula 4 and the third unit represented by Chemical Formula 5.

Although $R_1$ of the first unit is a hydrogen atom, it may be a chlorine atom, a fluorine atom, an alkyl group or an alkyl group including a fluorine atom instead.

Also, as $R_2$ of the first unit, an atom or a group that is not released by an acid and is selected from the group consisting of a hydrogen atom, an alkyl group, a cyclic aliphatic group, an aromatic group, a heterocycle, an ester group and an ether group can be used.

As $R_6$ of the second unit, for example, any of the protecting groups represented by Chemical Formula 7 may be widely used.

Although p of the second unit is 1, it may be 0 or any integer of 2 through 5 instead.

Although q of the third unit is 1, it may be 0 or any integer of 2 through 5 instead.

Now, a first synthesis method for the base polymer of the fourth pattern formation material will be described with reference to Chemical Formula 17.

Chemical Formula 17:

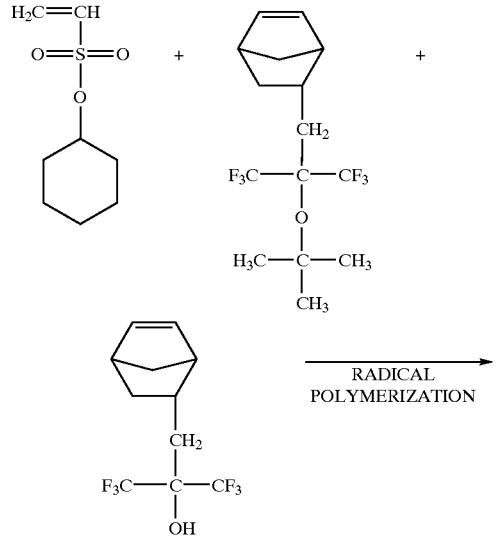

Specifically, as represented by Chemical Formula 17, the base polymer of the fourth pattern formation material is obtained through the radical polymerization of the first unit represented by Chemical Formula 1, the second unit represented by Chemical Formula 4 and the third unit represented by Chemical Formula 5. In this case, the first unit, the second unit and the third unit can be easily radical polymerized.

Next, a second synthesis method for the base polymer of the fourth pattern formation material will be described with reference to Chemical Formula 18.

Chemical Formula 18:

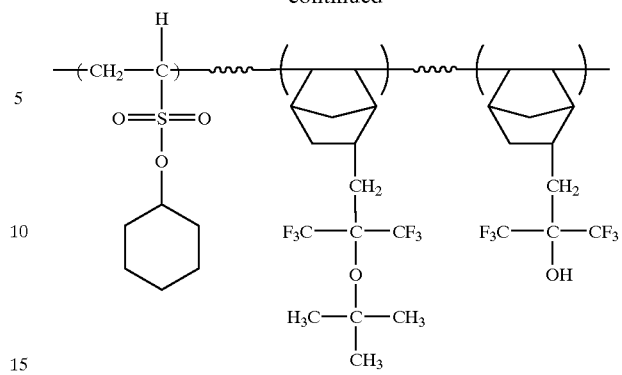

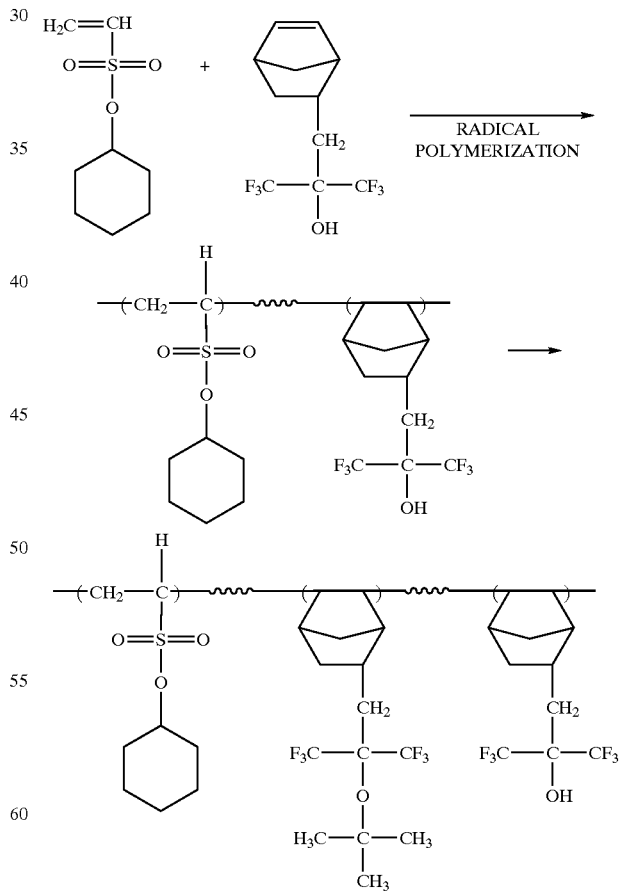

Specifically, as represented by Chemical Formula 18, a copolymer is obtained through the radical polymerization of the first unit represented by Chemical Formula 1 and the third unit represented by Chemical Formula 5, and $R_6$ is substituted for some of H of OH groups of the third unit included in the copolymer. In this case, the first unit and the third unit can be easily radical polymerized.

Although the $F_2$ laser beam is used as the exposing light in each of Embodiments 1 through 4, light of a wavelength of a 110 nm through 180 nm band, such as a $Xe_2$ laser beam, a $Kr_2$ laser beam, an ArKr laser beam, an $Ar_2$ laser beam; a soft-X ray beam of a wavelength of a 1 nm through 30 nm band; or a hard-X ray beam of a wavelength not longer than a 1 nm band can be used instead.

INDUSTRIAL APPLICABILITY

The first through fourth pattern formation materials and the first through fourth pattern formation methods according to the invention improve the transmittance of a resist film against light of a wavelength not longer than a 180 nm band.

What is claimed is:

1. A pattern formation material comprising:
   a base polymer including a first unit represented by Chemical Formula 1 and a second unit represented by Chemical Formula 2; and
   an acid generator:

Chemical Formula 1:

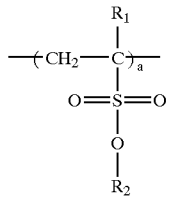

Chemical Formula 2:

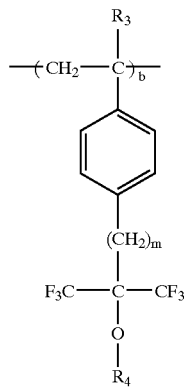

wherein $R_1$ and $R_3$ are the same or different and are a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_4$ is a protecting group released by an acid; m is an integer of 0 through 5; and a and b satisfy $0<a<1$, $0<b<1$ and $0<a+b\leq 1$.

2. The pattern formation material of claim 1, wherein said base polymer is prepared through radical polymerization of said first unit and said second unit.

3. The pattern formation material of claim 1, wherein said base polymer is prepared by obtaining a polymer through radical polymerization of said first unit and a precursor obtained before substituting $R_4$ for said second unit and by allowing $R_4$ to bond to said precursor included in said polymer.

4. A pattern formation material comprising:
   a base polymer including a first unit represented by Chemical Formula 1, a second unit represented by Chemical Formula 2 and a third unit represented by Chemical Formula 3; and
   an acid generator:

Chemical Formula 1:

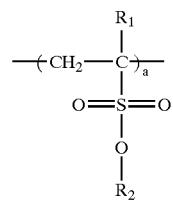

Chemical Formula 2:

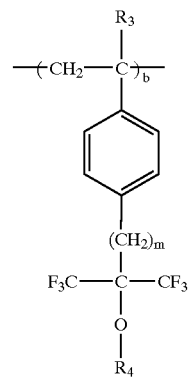

Chemical Formula 3:

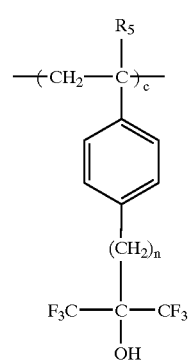

wherein $R_1$, $R_3$ and $R_5$ are the same or different and are a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_4$ is a protecting group released by an acid; m is an integer of 0 through 5; n is an integer of 0 through 5; and a, b and c satisfy $0<a<1$, $0<b<1$, $0<c<1$ and $0<a+b+c\leq 1$.

5. The pattern formation material of claim 4,
wherein said base polymer is prepared through radical polymerization of said first unit, said second unit and said third unit.

6. The pattern formation material of claim 4,
wherein said base polymer is prepared by obtaining a polymer through radical polymerization of said first unit and said third unit and by substituting $R_4$ for some of H of OH groups of said third unit included in said polymer.

7. A pattern formation material comprising:

a base polymer including a first unit represented by Chemical Formula 1 and a second unit represented by Chemical Formula 4; and an acid generator:

Chemical Formula 1:

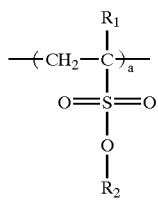

Chemical Formula 4:

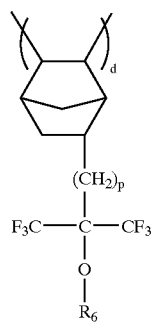

wherein $R_1$ is a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_6$ is a protecting group released by an acid; p is an integer of 0 through 5; and a and d satisfy $0<a<1$, $0<d<1$ and $0<a+d\leq1$.

8. The pattern formation material of claim 7,
wherein said base polymer is prepared through radical polymerization of said first unit and said second unit.

9. The pattern formation material of claim 7,
wherein said base polymer is prepared by obtaining a polymer through radical polymerization of said first unit and a precursor obtained before substituting $R_6$ for said second unit and by allowing $R_6$ to bond to said precursor included in said polymer.

10. A pattern formation material comprising:

a base polymer including a first unit represented by Chemical Formula 1, a second unit represented by Chemical Formula 4 and a third unit represented by Chemical Formula 5; and an acid generator:

Chemical Formula 1:

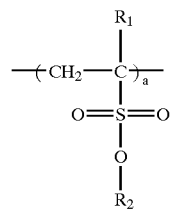

Chemical Formula 4:

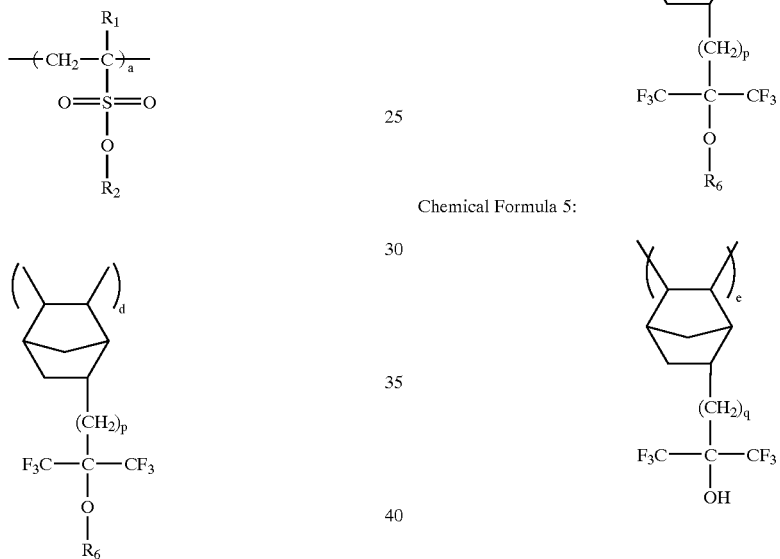

Chemical Formula 5:

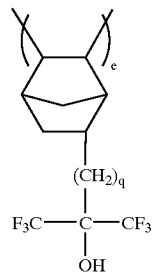

wherein $R_1$ is a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_6$ is a protecting group released by an acid; p is an integer of 0 through 5; q is an integer of 0 through 5; and a, d and e satisfy $0<a<1$, $0<d<1$, $0<e<1$ and $0<a+d+e\leq1$.

11. The pattern formation material of claim 10,
wherein said base polymer is prepared through radical polymerization of said first unit, said second unit and said third unit.

12. The pattern formation material of claim 10,
wherein said base polymer is prepared by obtaining a polymer through radical polymerization of said first unit and said third unit and by substituting $R_6$ for some of H of OH groups of said third unit included in said polymer.

13. A pattern formation method comprising the steps of:

forming a resist film by applying, on a substrate, a pattern formation material containing a base polymer including a first unit represented by Chemical Formula 1 and a second unit represented by Chemical Formula 2, and an acid generator:

Chemical Formula 1:

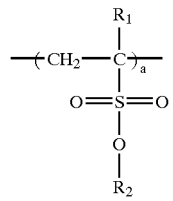

Chemical Formula 2:

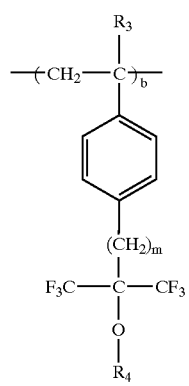

wherein $R_1$ and $R_3$ are the same or different and are a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_4$ is a protecting group released by an acid; m is an integer of 0 through 5; and a and b satisfy $0<a<1$, $0<b<1$ and $0<a+b\leq1$;

irradiating said resist film with exposing light of a wavelength not longer than a 180 nm band for pattern exposure; and forming a resist pattern by developing said resist film after the pattern exposure.

14. A pattern formation method comprising the steps of:

forming a resist film by applying, on a substrate, a pattern formation material containing a base polymer including a first unit represented by Chemical Formula 1, a second unit represented by Chemical Formula 2 and a third unit represented by Chemical Formula 3, and an acid generator:

Chemical Formula 1:

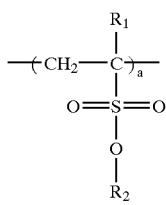

Chemical Formula 2:

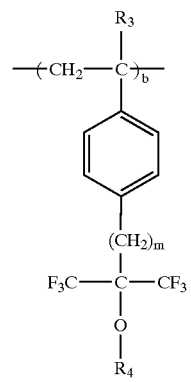

Chemical Formula 3:

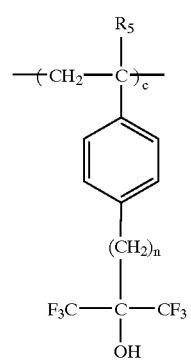

wherein $R_1$, $R_3$ and $R_5$ are the same or different and are a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_4$ is a protecting group released by an acid; m is an integer of 0 through 5; n is an integer of 0 through 5; and a, b and c satisfy $0<a<1$, $0<b<1$, $0<c<1$ and $0<a+b+c\leq1$;

irradiating said resist film with exposing light of a wavelength not longer than a 180 nm band for pattern exposure; and forming a resist pattern by developing said resist film after the pattern exposure.

15. A pattern formation method comprising the steps of:

forming a resist film by applying, on a substrate, a pattern formation material containing a base polymer including a first unit represented by Chemical Formula 1 and a second unit represented by Chemical Formula 4, and an acid generator:

Chemical Formula 1:

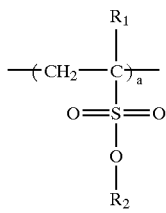

Chemical Formula 4:

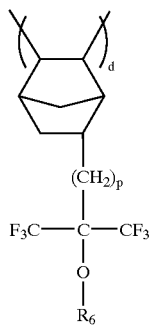

wherein $R_1$ is a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_6$ is a protecting group released by an acid; p is an integer of 0 through 5; and a and d satisfy $0<a<1$, $0<d<1$ and $0<a+d \leq 1$;

irradiating said resist film with exposing light of a wavelength not longer than a 180 nm band for pattern exposure; and forming a resist pattern by developing said resist film after the pattern exposure.

16. A pattern formation method comprising the steps of:

forming a resist film by applying, on a substrate, a pattern formation material containing a base polymer including a first unit represented by Chemical Formula 1, a second unit represented by Chemical Formula 4 and a third unit represented by Chemical Formula 5, and an acid generator:

Chemical Formula 1:

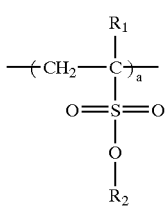

-continued
Chemical Formula 4:

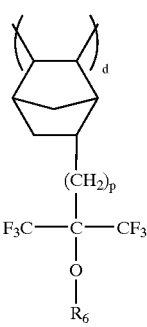

Chemical Formula 5:

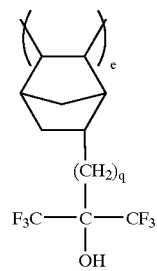

wherein $R_1$ is a hydrogen atom, a chlorine atom, a fluorine atom, an alkyl group or an alkyl group including a fluorine atom; $R_2$ is an atom or a group that is not released by an acid and is selected from the group consisting of a hydrogen atom, an alkyl group, a cyclic aliphatic group, an aromatic group, a heterocycle, an ester group and an ether group; $R_6$ is a protecting group released by an acid; p is an integer of 0 through 5; q is an integer of 0 through 5; and a, d and e satisfy $0<a<1$, $0<d<1$, $0<e<1$ and $0<a+d+e \leq 1$;

irradiating said resist film with exposing light of a wavelength not longer than a 180 nm band for pattern exposure; and forming a resist pattern by developing said resist film after the pattern exposure.

17. The pattern formation method of any of claims 13 through 16, wherein said exposing light is a $Xe_2$ laser beam, a $F_2$ laser beam, a $Kr_2$ laser beam, an ArKr laser beam or an $Ar_2$ laser beam.

18. The pattern formation method of any of claims 13 through 16, wherein said exposing light is a soft-X ray beam.

19. The pattern formation method of any of claims 13 through 16, wherein said exposing light is a hard-X ray beam.

* * * * *

UNITED STATES PATENT AND TRADEMARK OFFICE
CERTIFICATE OF CORRECTION

PATENT NO. : 6,830,869 B2
DATED : December 14, 2004
INVENTOR(S) : Shinji Kishimura et al.

It is certified that error appears in the above-identified patent and that said Letters Patent is hereby corrected as shown below:

<u>Title page,</u>
Item [73], Assignee, change "Atsushita" to -- Matsushita --.

Signed and Sealed this

Nineteenth Day of April, 2005

JON W. DUDAS
*Director of the United States Patent and Trademark Office*